(12) United States Patent  
Chen et al.

(10) Patent No.: US 8,106,302 B2
(45) Date of Patent: Jan. 31, 2012

(54) CIRCUIT BOARD OF COMMUNICATION PRODUCT AND MANUFACTURING METHOD THEREOF

(75) Inventors: Kuo-Ching Chen, Taipei (TW); Chung-Shao Huang, Taipei County (TW); Ching-Feng Hsieh, Taipei (TW); Jen-Huan Yu, Taipei (TW); Cheng-Wen Dai, Taipei (TW)

(73) Assignee: Askey Computer Corp., Taipei (TW)

( * ) Notice: Subject to any disclaimer, the term of this patent is extended or adjusted under 35 U.S.C. 154(b) by 533 days.

(21) Appl. No.: 12/341,448

(22) Filed: Dec. 22, 2008

(65) Prior Publication Data

US 2010/0089619 A1    Apr. 15, 2010

(30) Foreign Application Priority Data

Oct. 13, 2008 (TW) ............................... 97139175 A

(51) Int. Cl.
*H05K 1/00* (2006.01)
*H05K 1/11* (2006.01)
(52) U.S. Cl. ........ 174/252; 174/258; 174/260; 174/262; 174/263
(58) Field of Classification Search ................... None
See application file for complete search history.

(56) References Cited

U.S. PATENT DOCUMENTS

| 5,014,160 | A  | * | 5/1991  | McCoy, Jr. .................. 361/818 |
| 6,344,609 | B1 | * | 2/2002  | Nakano ......................... 174/351 |
| 6,528,866 | B2 |   | 3/2003  | Kawanishi et al. |
| 6,687,135 | B1 | * | 2/2004  | Kitade .......................... 361/816 |
| 6,689,670 | B2 |   | 2/2004  | Kawanishi et al. |
| 6,781,851 | B2 | * | 8/2004  | Daoud et al. ................. 361/818 |
| 7,145,084 | B1 | * | 12/2006 | Sarihan et al. ............... 174/361 |
| 7,295,083 | B2 | * | 11/2007 | Kimata et al. .................. 333/12 |
| 7,443,693 | B2 | * | 10/2008 | Arnold et al. ................. 361/800 |
| 7,480,153 | B2 | * | 1/2009  | Kong ............................ 361/818 |
| 7,557,307 | B2 | * | 7/2009  | Nishizawa et al. ........... 174/384 |
| 7,633,170 | B2 | * | 12/2009 | Yang et al. .................... 257/787 |
| 7,746,666 | B2 | * | 6/2010  | Kakinoki et al. ............. 361/816 |

FOREIGN PATENT DOCUMENTS

TW              521561        2/2003

\* cited by examiner

*Primary Examiner* — Boris Chervinsky

(74) *Attorney, Agent, or Firm* — Rabin & Berdo, P.C.

(57) ABSTRACT

The present invention provides a circuit board of a communication product and a manufacturing method thereof. The circuit board comprises a main body of a circuit board and an isolation cover. A surface of the main body of the circuit board has a power transistor, an insulating layer, a plurality of first openings disposed at intervals on the insulating layer and around the power transistor, and a plurality of soldering portions exposed from the first openings respectively. The isolation cover comprises a cover body and a plurality of second openings equidistantly opened on a lateral side of the cover body. The isolation cover is disposed on the surface of the main body of the circuit board, and is soldered to the soldering portions through a local spot soldering process.

13 Claims, 5 Drawing Sheets

CIRCUIT BOARD OF COMMUNICATION PRODUCT AND MANUFACTURING METHOD THEREOF

FIELD OF INVENTION

The present invention relates to a shielding technology capable of eliminating interferences and noises, and more particularly to a circuit board of a communication product and a manufacturing method thereof.

BACKGROUND OF THE INVENTION

With the development of the broadband network and the trend of the digital technology, the wireless products with wireless transceiving functions are increasingly popular, such as a wireless network access point (AP), a mobile phone, a personal digital assistant (PDA), and a notebook computer. The wireless products not only provide extensive range of functions but also deliver more convenient and effective services. However, the wireless communication products are sensitive to the surrounding electromagnetic waves caused by other wireless communication systems or external noises.

For example, when a wireless product performs the data wireless transmission under a high power state, the high frequency harmonic waves are extremely easily generated by non-linear characteristics of active components, so as to result in an electro-magnetic interference (EMI) emission, which is often the prime contributor to the performance degradation. In order to solve the problem, legal regulations are made in many countries to regulate and restrict illegal input applications and usages of the wireless products. As a result, when the designers and manufactures of the wireless product design a control line of the wireless product, the requirements of the related regulations must be fulfilled and incorporated into the wireless design. Furthermore, the circuit of the wireless product is also affected by the signals of the external electromagnetic wave, such as, radio frequency (RF) wireless signals, to result performance inconsistencies.

Therefore, it is a critical factor for the designers and developers to know how to effectively eliminate the interference and the noise in order to improve the performance of the wireless products. Several conventional methods are proposed to reduce the impact of EMI and RF emissions on wireless communication products, such as the methods disclosed in, ROC Patent No. 521561, U.S. Pat. No. 6,689,670, and U.S. Pat. No. 6,528,866.

Conventionally, an isolation cover is disposed on a circuit board to eliminate emissions related to EMI or RF interference. As shown in FIG. 1, an isolation cover 22 is fully soldered onto a main body 20 of a circuit board 2 by adopting a surface mount technology (SMT), so that the isolation cover 22 can cover part of components on the circuit board 2, such as, the chip(s) located on a surface of the main body 20 of the circuit board 2. A reflow-soldering process is performed on the circuit board 2 through a tin oven (not shown).

However, this conventional method is used a soldering technique called a single-piece fully soldering process to solder the isolation cover 22 entirely onto the main body 20 of the circuit board 2. After the reflow-soldering process, if some of the components underneath the isolation cover 22 fail, a desoldering process must be performed to detach the isolation cover 22 in order to replace the corresponding components. In this manner, the maintenance is costly and time consuming, and the surface of the circuit board main body 20 is easily damaged or deformed, more significantly, the detached isolation cover 22 cannot be reused. As a result, the fabrication cost of the conventional method is extremely high.

Meanwhile, when the isolation cover 22 is disposed onto the circuit board main body 20, the components underneath are entirely covered. The heat generated during the soldering process cannot be effectively dissipated, resulting a temperature differentiation between the components, which leads to a tombstone effect. Thus, the components located in the isolation cover 22 can fail easily.

In order to solve the disadvantage of the single-piece fully soldering technology, a two-pieces fully soldering technology is provided as shown in FIG. 2. A lower frame 24 and an upper cover 26 are used to replace the single piece isolation cover. During assembling process, the lower frame 24 is firstly soldered to the main body 20 of a circuit board 2', and the upper cover 26 is used to cover the main body 20 of the circuit board 2' after the circuit board 2' passing through the tin oven, so that the upper cover 26 can be integrated to the lower frame 24.

However, the requirements of performing the two-pieces fully soldering process are more complicated, and the cost is relatively higher. Furthermore, the lower frame 24 is required to be firstly soldered, and after the circuit board 2' passing through the tin oven, a second processing is performed on the upper cover 26 for the second time. Thus, the assembling process of this method is more costly.

Both the single-piece fully soldering technology and the two-pieces fully soldering technology require the solder to perform the soldering process, and the heat dissipation is the major problem during the soldering process that can severely damage to the components on the circuit board and the circuit board itself.

From the above-mentioned techniques, the conventional methods have serious drawbacks. Therefore, it is an objective of the present invention to provide a true solution to resolve all the drawbacks, and an improved circuit board of a wireless communication product and a fabrication method that can successfully eliminate the interferences.

SUMMARY OF THE INVENTION

In view of the disadvantages of the conventional art, the present invention is directed to a circuit board of a communication product and a manufacturing method thereof, so as to simplify a process and a maintaining procedure.

The present invention is further directed to a circuit board of a communication product and a manufacturing method, that increases the productivity and improve the quality of the performance.

In order to achieve the above and other objectives, the present invention provides a circuit board, which is applied to a communication product. The circuit board comprises a main body of the circuit board comprising a power transistor and a predetermined covering region that is used for covering the power transistor; an insulating layer having a plurality of openings disposed at intervals along the circumference of the predetermined covering region; and a plurality of soldering portions, that are respectively exposed from of each opening.

The present invention further provides a circuit board, which is applied to a communication product. The circuit board includes a main body of a circuit board and an isolation cover. The main body of circuit board has a power transistor, an insulating layer, a plurality of first openings disposed at intervals on the insulating layer and around the power transistor, and a plurality of soldering portions exposed respectively from the first openings disposed on a surface thereof. The isolation cover comprises a cover body of a cover soldered to each soldering portion and a plurality of second openings equidistantly opened on a lateral side of the cover body of the cover.

In the above-mentioned circuit board, each soldering portion is corresponding to a corner of the cover body. Each soldering portion is used as a soldering pad. Each soldering portion is provided with a solder material respectively. Each insulating layer is a solder mask layer. The circuit board further comprises a plurality of heat dissipation portions equidistantly opened on a top surface of the cover body in accordance with a preferred embodiment of the present invention. A width (a diameter of the heat dissipation portion) of the second opening is between 1λ and 2λ, λ=v/f, in which λ is the wave length, v is the speed (m/s), f is the frequency (Hz), and a maximum value of f is 26.5 GHz. Every second opening is located on a lateral side of the cover body, which is, for example, a rectangular opening.

The present invention further provides a method for manufacturing a circuit board of a communication product. The method of the present invention comprises: providing a main body of a circuit board, in which the main body of the circuit board has a power transistor, an insulating layer, a plurality of first openings disposed at intervals on the insulating layer and around the power transistor, and a plurality of soldering portions exposed from each first opening respectively disposed on a surface thereof; providing an isolation cover, in which the isolation cover comprises a cover body and a plurality of second openings equidistantly opened on a lateral side of the cover body; disposing the isolation cover onto the surface of the main body of the circuit board; and soldering the isolation cover to each soldering portion through a method of local spot soldering.

In the above-mentioned manufacturing method, the local spot soldering may be performed through a SMT.

Comparing with the conventional art, the present invention designs a circuit board, in which the local spot soldering technique can be performed, to prevent the non-uniformity of the heat dissipation problem from occurring during the soldering process. As a matter of fact, one of the advantages of the local spot soldering is to allow partial desoldering when the isolation cover is required to be detached, as a result, the time and cost can be drastically reduced. Therefore, the present invention simplifies the manufacturing process and the maintenance procedure. At the same time, the present invention provides a method in which the reflow-soldering temperature can be modified through the openings or other heat dissipation portions, in such that the internal reflow-soldering temperature becomes uniformly. The productivity will increase and the quality of the performance can be drastically improved.

BRIEF DESCRIPTION OF THE DRAWINGS

The present invention will become more fully understood from the detailed description given herein below for illustration only, and thus are not limitative of the present invention, and wherein:

FIGS. 5a and 5b are schematic views of the circuit board according to another embodiment of the present invention, in which FIG. 5a is a schematic partial three-dimensional view, and FIG. 5b is a cross sectional view.

DETAILED DESCRIPTION OF THE INVENTION

It should be noted that a circuit board of this embodiment and other embodiments is applied to a communication product, various circuit boards used by different communication products can be applicable although they may slightly be modified. In the present invention, the shielding technology is improved to effectively eliminate the interference and the noise in the circuit board to improve the performance of communication product.

Figure 1:
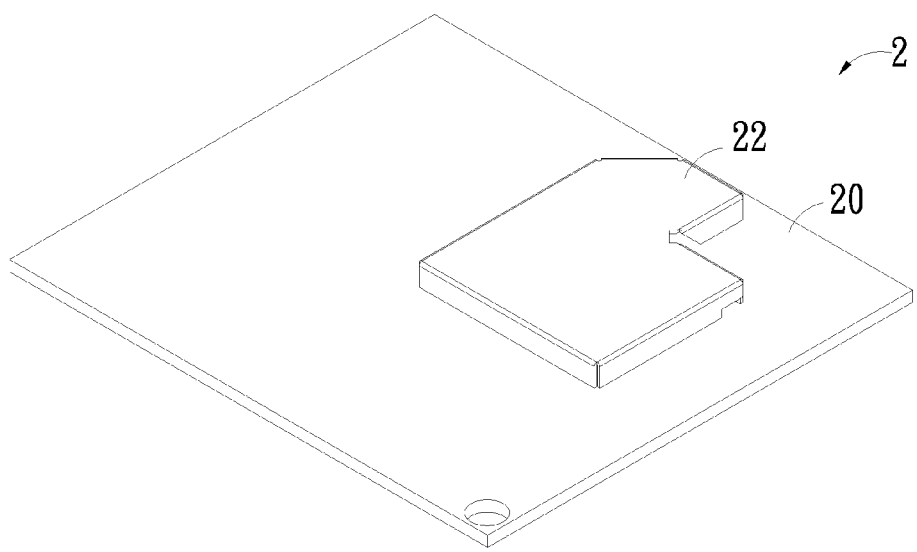
FIG. 1 is a schematic view of a conventional circuit board having a single-piece fully soldered isolation cover.
Figure 2:
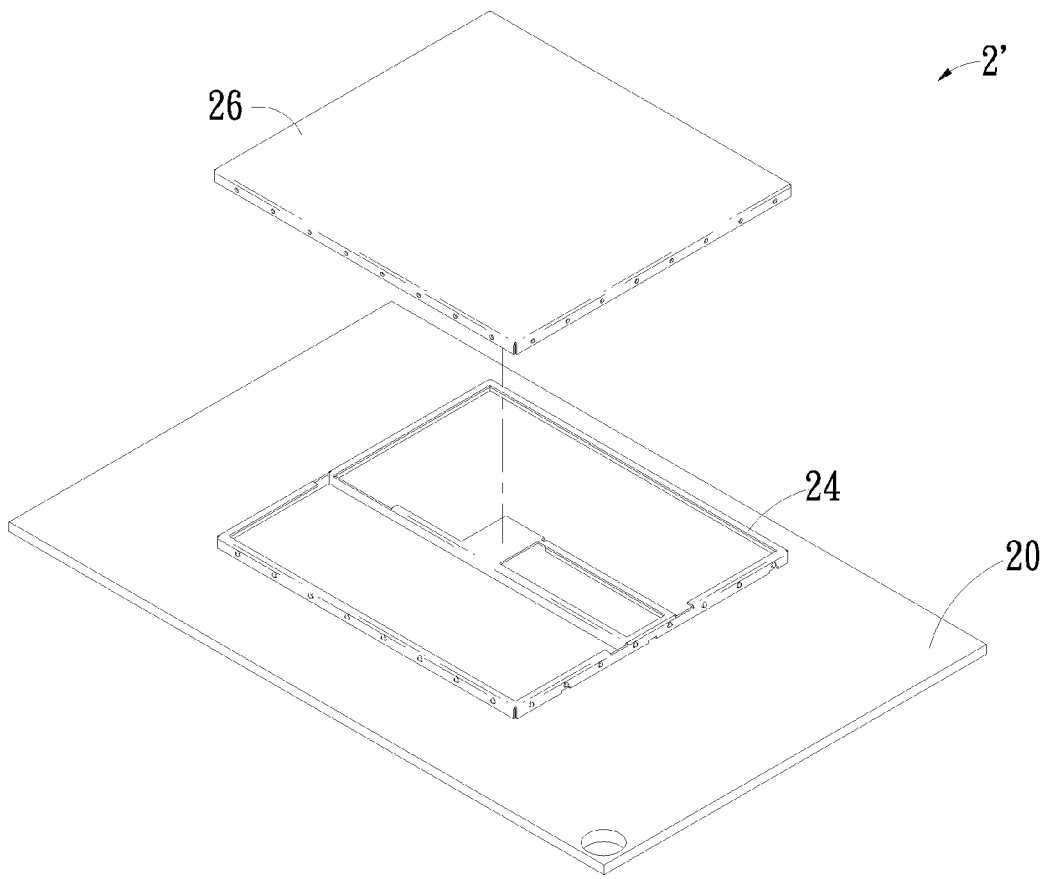
FIG. 2 is a schematic view of a conventional circuit board having a two-pieces fully soldered isolation cover.
Figure 3A:
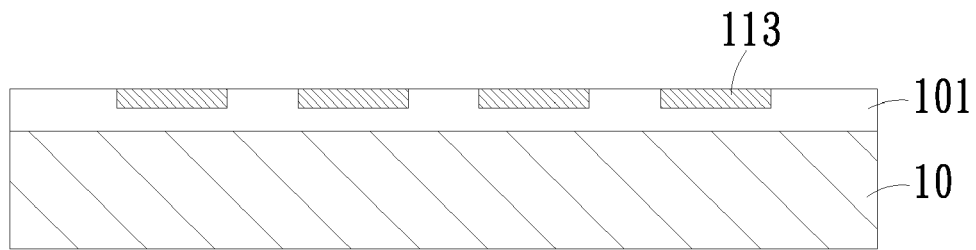
FIGS. 3a to 3e are schematic views of a method for manufacturing a circuit board according to a first embodiment of the present invention.
Figure 3B:
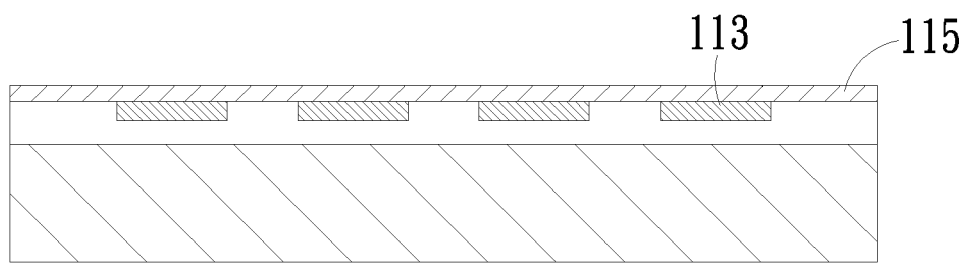
Figure 3C:
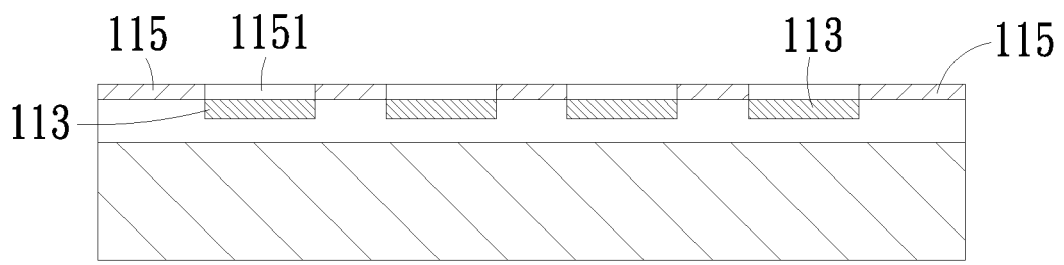
Figure 3D:
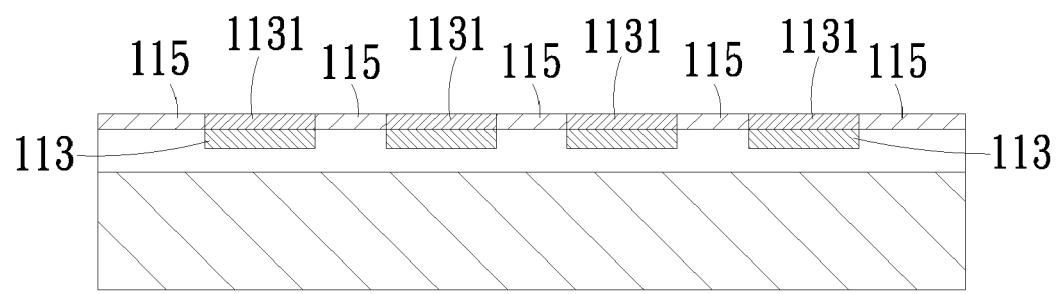

Referring to FIGS. 3a to 3e, schematic views of a first embodiment of the present invention are shown. As shown in FIG. 3a, a substrate 10 is provided and has a power transistor (not shown, described hereafter) and a line layer 101 disposed on a surface thereof. A plurality of soldering portions 113 are formed in the line layer 101. As shown in FIG. 3b, an insulating layer 115 is entirely formed on the surface of the line layer 101. Next, as shown in FIG. 3c, at the position on which an isolation cover (that is, a predetermined covering region, described hereafter) is predetermined to be disposed, a plurality of openings 1151 (first openings) are formed at intervals on the insulating layer 115, and each soldering portion 113 is exposed respectively from every opening 1151. FIG. 3d, each soldering portion 113 is provided with a solder material 1131 above respectively.

The solder material 1131 is deposited on each soldering portion 113 of the circuit board through a stencil printing technology. For example, a stencil (not shown) having a plurality of grids is disposed, after the solder material 1131 is deposited on the stencil, a roller can be used to roll back and forth on the stencil, or a spraying method can be adopted to spray the solder material 1131 through the grids to form the solder material 1131 on each soldering portion 113.

According to the embodiment, a plurality of openings 1151 (first openings) are formed before the circuit board passes through the tin oven, such that each soldering portion 113 is respectively exposed. However, in other embodiments, the above-mentioned stencil design is modified, and a required layout is directly printed in the predetermined covering region, wherein the insulating layer 115, the plurality of openings 1151 (first openings) positioned at intervals on the insulating layer 115, and the soldering portions 113 exposed from openings 1151 are all formed simultaneously in one process. As a matter of fact, the stencil design is not restrained to the above-mentioned structures.

Figure 3E:
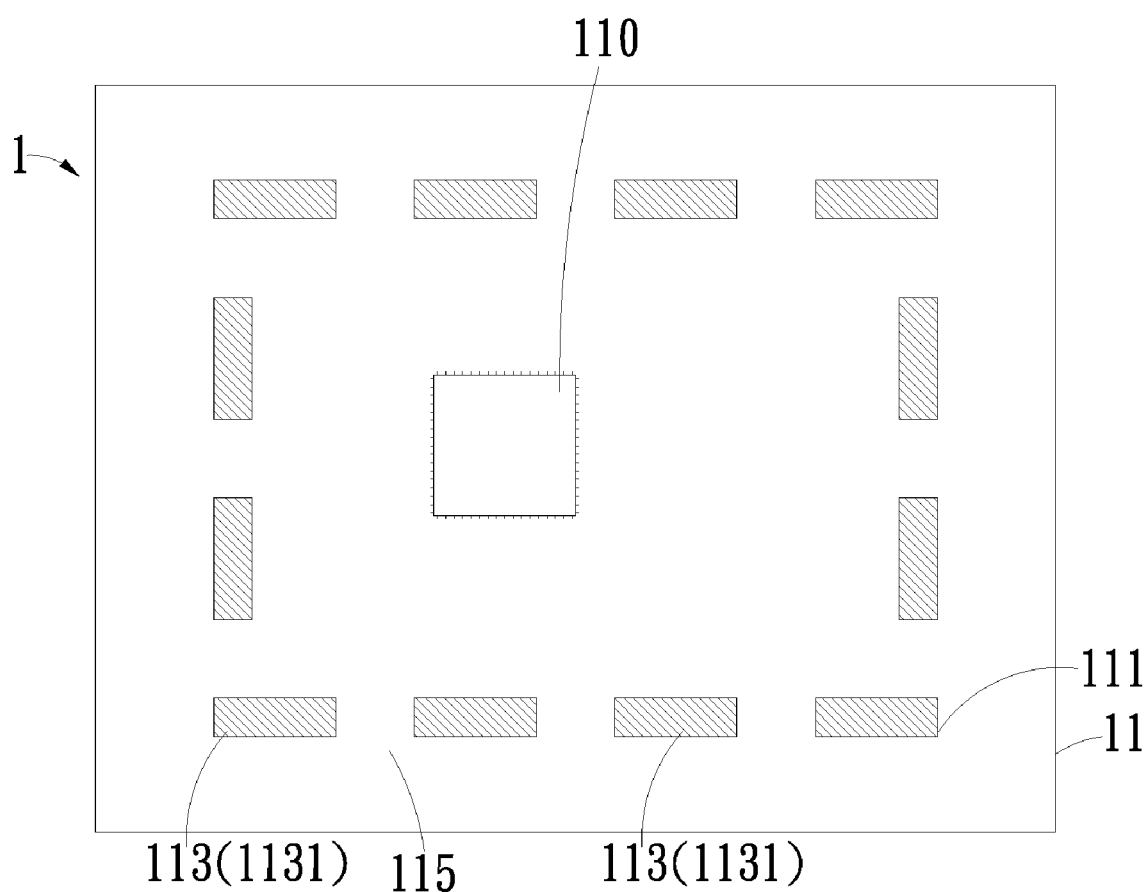

As shown in FIG. 3e, in accordance with the preferred embodiment of the present invention, a circuit board 1 is provided. The circuit board 1 comprises a main body 11 of circuit board 1 having a predetermined covering region 111; an insulating layer 115 disposed along the edges (circumference) of the predetermined covering region 111 and has a plurality of openings (first openings) 1151 at intervals; and a plurality of soldering portions 113, respectively exposed from each opening 1151. In this embodiment, the power transistor 110 as shown in FIG. 3e can be firstly disposed, but the power transistor 110 can also be disposed after the soldering portions 113 and the insulating layer 115 are formed. The predetermined covering region 111 is used to at least cover the power transistor 110. As a result, the application of present invention is not restricted to this embodiment. The power transistor 110 can be, for example, a chip, and each opening (first opening) 1151 is located around the power transistor 110.

The main body 11 of the circuit board 1 has the predetermined covering region 111 on a surface, in which the isolation cover is disposed. According to the embodiment, the main body 11 of the circuit board 1 and the predetermined covering region 111 are rectangular-shaped. The shape of the components of the present invention is not limited.

Each insulating layer 115 is a solder mask layer. Each soldering portion 113 is, for example, a pad, and each soldering portion 113 respectively has a solder material 1131. In this embodiment, each soldering portion 113 is correspondingly disposed on the edges of the predetermined covering region 111, and is located on the corner of the predetermined covering region 111. At the same time, the soldering portions 113 are spaced by the insulating layer 115, such that a local spot soldering process is adopted when the isolation cover is integrated to the circuit board 1.

The predetermined covering region 111 is rectangular-shaped, and each soldering portion 113 is located on the corner and two sides of the predetermined covering region 111. According to the mechanics analysis, the stress will be concentrated at the corner. In other words, the corner is the weakest position than others. Therefore the corresponding soldering portions 113 are disposed on the corners and the two sides of the predetermined covering region 111 to strengthen the position. However, in other embodiments, the shape of the predetermined covering region 111 and the disposing positions of each soldering portion 113 can also be changed. Each soldering portion 113 can also be disposed on the positions having concentrated stress of the predetermined covering regions 111 with different shapes, other than the corner(s) or the sidewalls. In other words, the locations of the soldering portions 113 are not restricted to the shapes or the corners or the sidewalls of the predetermined covering regions 111. Although in this embodiment, eight soldering portions 113 are disposed. But according to other preferred embodiments, two or more soldering portions 113 are disposed and the local spot soldering process is performed.

In this embodiment, the circuit board 1 is a circuit board without an isolation cover. The circuit board 1 may also be a circuit board with the isolation cover assembled onto the main body 11 of the circuit board 1.

Figure 4:
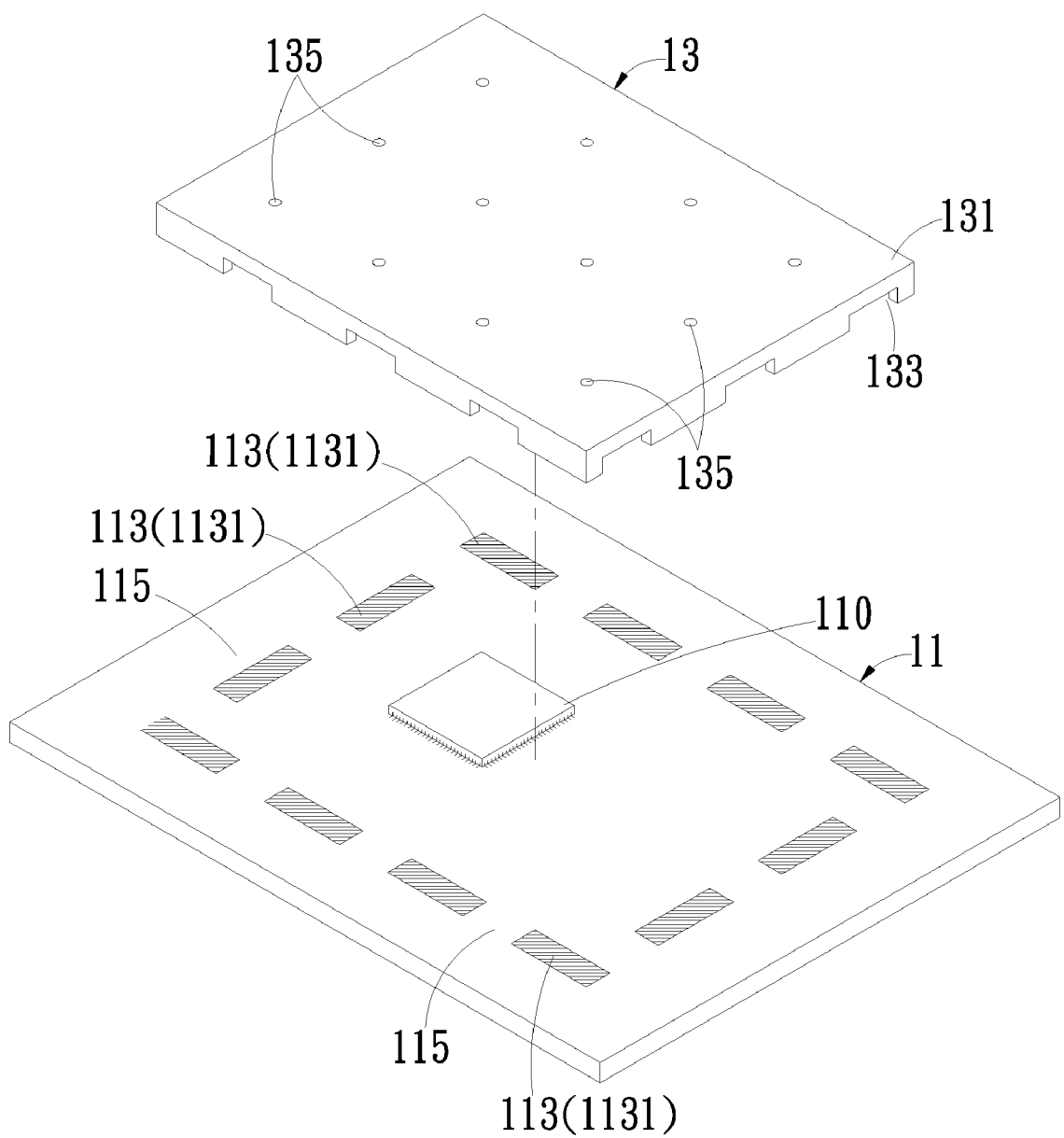
FIG. 4 is a schematic view of the circuit board according to a second embodiment of the present invention.
Figure 5A:
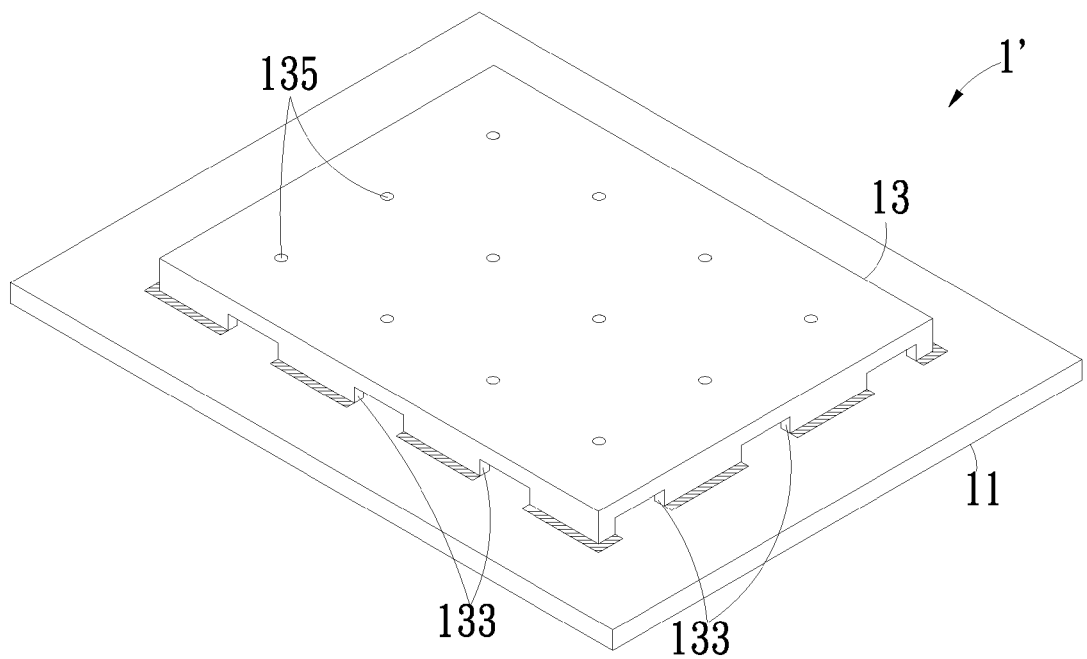
Figure 5B:
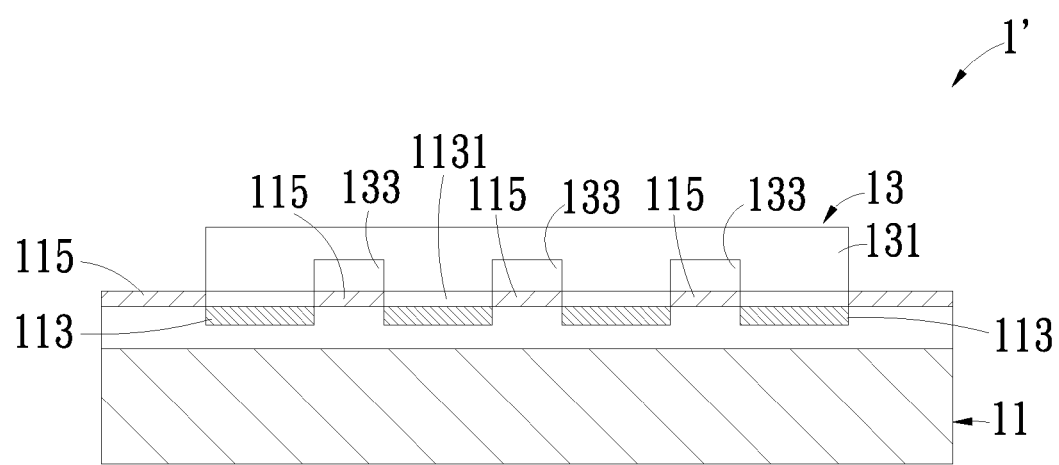

Referring to FIGS. 4 to 5b, schematic views of a second embodiment of the present invention are shown. As shown in FIG. 4, a circuit board 1' of this embodiment comprises a main body 11 of circuit board 1 and an isolation cover 13 disposed on the main body 11 of circuit board 1, in which the components that are identical or similar to those of the first embodiment are marked with identical or similar reference numerals.

A surface of the main body 11 has a power transistor 110, an insulating layer 115, a plurality of first openings 1151 (as shown in FIG. 3b of the first embodiment) disposed at intervals on the insulating layer 115 and around the power transistor 110, and a plurality of soldering portions 113 exposed from each first opening 1151 respectively.

The isolation cover 13 comprises a cover body 131 soldered to each soldering portion 113, a plurality of second openings 133 equidistantly opened on the lateral side of the cover body 131, a plurality of heat dissipation portions 135 equidistantly opened on the top surface of the cover body 131.

The cover body 131 of the second embodiment is, for example, a rectangular-shaped cover body. The design of the cover body 131 of present invention is not limited to rectangular-shaped structure. The width of each second opening 133 is larger than or equal to a pitch of each first opening 1151. The distance and an opening height between every two second openings 133 are designed according to a wave length calculated in respect of the frequency (maximally being 26.5 GHz) of the communication product. Generally, after converting to a wave length formula, when the value of the opening width is smaller than 1.2 mm, it indicates that most of the EMI high frequency noise can be eliminated.

For example, an aperture ratio of each second opening 133 disposed on the side of the cover main body 131 must satisfy the formula as follows:

$$\lambda = v/f \qquad \text{(Formula 1)}$$

$\lambda$ is a wave length, $v$ is a speed (m/s), and $f$ is a frequency (Hz). An EMI maximum value of f is 26.5 GHz, when v is $3*10^8$ m, $\lambda$ is 1.2 mm, which is the value meets the requirements of the EMI Safety rule of different countries.

At the same time, for the RF communication technology, when a wireless local area network (WLAN) or an ultra wide band (UWB) communication protocol is applied to the communication, the value of f in the WLAN is usually from 2.4 GHz to 5 GHz, and the value of f in the UWB system is usually from 3 GHz to 10 GHz. Therefore, as long as the value of f is more than double frequency of the low power UWB (that is, approximately 1.2 mm), the requirement of shielding the external noise is achieved. In addition, disregard whether there is linear or the non-linear effect, when the value of f is wireless fidelity (WIFI) 2.4 GHZ, and the width of each second opening is 10 times $\lambda$ (5 times $\lambda$ for the WIFI 5 GHz), it is enough to shield the external noise.

It may be known that the width of each second opening 133 is between $1\lambda$ and $2\lambda$.

Each heat dissipation portion 135 can be used for heat dissipation, although in this embodiment, twelve heat dissipation portions 135 are respectively disposed on the top surface of the cover body 131 corresponding to each second opening 133, it should be noted that the disposing position, the size, and the number of the heat dissipation portions 135 are not restricted to the embodiments. The heat dissipation portions 135 can be omitted in the design. The aperture ratio of each heat dissipation portion 135 may be calculated by using the Formula 1, and its value is between $1\lambda$ and $2\lambda$.

When it intends to assemble the isolation cover 13 to the main body 11 of the circuit board 1, as shown in FIG. 4, the main body 11 and the isolation cover 13 are provided. The main body 11 has an insulating layer 115, a plurality of first openings 1151 disposed at intervals on the insulating layer 115, and a plurality of soldering portions 113 respectively exposed from each first opening 1151 disposed on a surface thereof. The isolation cover 13 comprises a cover body 131 and a plurality of second openings 133 equidistantly opened on the lateral side of the cover body 131.

Then, the isolation cover 13 is disposed on the surface of the main body 11 of the circuit board 1. In this embodiment, the surface of the main body 11 has the predetermined covering region 111, such that the isolation cover 13 is disposed after being aligned to predetermined covering region 111. The shape of the predetermined covering region 111 is not limited to particular shapes. Therefore it can be changed in accordance with the shape of the isolation cover 13.

Finally, the isolation cover 13 is soldered to the soldering portions 113 through the local spot soldering process. In this process, the local spot soldering is performed on each soldering portion 113 through the SMT technique in order to integrate the isolation cover 13 fixedly onto the main body 11 of the circuit board 1.

As shown in FIGS. 5a and 5b, the isolation cover 13 of the circuit board 1' has the second openings 133 equidistantly disposed on the lateral side to prevent the RF noise interference, and the height and the width of each second opening 133 are optimally adjusted in accordance with the wave length of the communication product. Meanwhile, the second openings 133 and the heat dissipation portions 135 on the lateral side of the isolation cover 13 can be used for heat dissipation in order to unify the internal reflow-soldering temperature, and to increase the productivity. In addition, in the main body 11 of the circuit board 1, the soldering portions 113 are spaced by the insulating layer 115 without using the entire soldering. As a result, the time consuming on soldering process is reduced, heat dissipation is effectively dissipated, and the maintenance cost is decreased.

Further, when it is necessary to disassemble the isolation cover 13, only partial desoldering is required to be performed on the circuit board 1, such as the soldering points between the isolation cover 13 and the soldering portions 113. Thus, implementation of the local spot soldering technology of the present invention is to effectively reduce time consuming during the soldering process and to simply the manufacturing process, such as less time is required to partially desoldering the soldering points between the isolation cover and the soldering portions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A circuit board applied to a communication product, comprising:
   a power transistor;
   a main body having a surface that the power transistor is embedded within, the surface including
      an insulating layer,
      a plurality of first openings disposed at intervals in the insulating layer and around the power transistor, and
      a plurality of soldering portions each being exposed from a respective one of the first openings; and
   an isolation cover covering the main body, a cover body of the isolation cover being soldered to each soldering portion, and a plurality of second openings being equidistantly spaced on a lateral side of the cover body,
   a width of each second opening is between $1\lambda$ and $2\lambda$, wherein $\lambda = v/f$ and
      $\lambda$ is a wavelength of a wave emitted from the communication product,
      v is a speed (m/s) of the wave, and
      f is a frequency (Hz) of the wave, a maximum value of f being 26.5 GHz.

2. The circuit board according to claim 1, wherein the insulating layer is a solder mask layer.

3. The circuit board according to claim 1, wherein each soldering portion corresponds to a respective corner of the cover body.

4. The circuit board according to claim 1, wherein each soldering portion is a pad.

5. The circuit board according to claim 1, wherein each soldering portion is provided with a solder material.

6. The circuit board according to claim 1, wherein each second opening is a rectangular opening.

7. The circuit board according to claim 1, further comprising a plurality of heat dissipation portions equidistantly spaced on a top surface of the cover body.

8. The circuit board according to claim 7, wherein each heat dissipation portion is a circular hole.

9. The circuit board according to claim 7, wherein a pitch of each heat dissipation portion is between the $1\lambda$ and the $2\lambda$.

10. A circuit board applied to a communication product, comprising:
    a power transistor;
    a main body, the power transistor disposed on the main body, the main body including a predetermined covering region where the power transistor is covered;
    an insulating layer, disposed on the main body, and having a plurality of first openings disposed at intervals around the predetermined covering region;
    a plurality of soldering portions each being exposed from a respective one of the first openings; and
    an isolation cover covering the predetermined covering region and the power transistor, a cover body of the isolation cover being soldered to each soldering portion, and a plurality of second openings being equidistantly spaced on a lateral side of the cover body,
    a width of each second opening is between $1\lambda$ and $2\lambda$, wherein $\lambda = v/f$ and
       $\lambda$ is a wavelength of a wave emitted from the communication product,
       v is a speed (m/s) of the wave, and
       f is a frequency (Hz) of the wave, a maximum value of f being 26.5 GHz.

11. The circuit board according to claim 10, wherein the insulating layer is a solder mask layer.

12. The circuit board according to claim 10, wherein each soldering portion is a pad.

13. The circuit board according to claim 10, wherein each soldering portion is provided with a solder material.

* * * * *